United States Patent
Tsai (10) Patent No.: US 8,281,208 B2
(45) Date of Patent: Oct. 2, 2012

(54) RECEIVER WITH CAPABILITY OF CORRECTING ERROR

(75) Inventor: Tien-Ju Tsai, Tainan (TW)

(73) Assignee: Himax Media Solutions, Inc., Tainan County (TW)

( * ) Notice: Subject to any disclaimer, the term of this patent is extended or adjusted under 35 U.S.C. 154(b) by 275 days.

(21) Appl. No.: 12/791,801

(22) Filed: Jun. 1, 2010

(65) Prior Publication Data

US 2011/0296269 A1 Dec. 1, 2011

(51) Int. Cl.
*H03M 13/00* (2006.01)
(52) U.S. Cl. ......... 714/752; 714/786; 375/233; 375/340
(58) Field of Classification Search .................. 714/752, 714/786; 375/233, 340
See application file for complete search history.

(56) References Cited

U.S. PATENT DOCUMENTS

| | | | | |
|---|---|---|---|---|
| 5,377,266 | A * | 12/1994 | Katta et al. | 380/217 |
| 5,887,061 | A * | 3/1999 | Sato | 380/217 |
| 5,946,355 | A * | 8/1999 | Baker | 375/286 |
| 6,459,730 | B1 * | 10/2002 | Samueli et al. | 375/233 |
| 6,847,602 | B2 * | 1/2005 | Sonu | 369/59.21 |
| 6,904,110 | B2 * | 6/2005 | Trans et al. | 375/350 |
| 6,965,651 | B1 * | 11/2005 | Chou | 375/340 |
| 7,035,326 | B1 * | 4/2006 | Heidari et al. | 375/229 |
| 7,167,215 | B2 * | 1/2007 | Markman et al. | 348/726 |
| 7,180,963 | B2 * | 2/2007 | Wang et al. | 375/324 |
| 7,881,365 | B2 * | 2/2011 | Lai et al. | 375/232 |
| 8,107,573 | B2 * | 1/2012 | Chang | 375/350 |

* cited by examiner

*Primary Examiner* — Esaw Abraham
(74) *Attorney, Agent, or Firm* — Stout, Uxa, Buyan & Mullins, LLP (57) ABSTRACT

A receiver with capability of correcting error is disclosed. A soft slicer generates quantized data and associated soft data. A decoder with error recovery generates decoded quantized data and a soft sequence, and is capable of correcting one bit of the quantized data. A serial-to-parallel (S/P) converter with code corrector generates parallel data, and is capable of correcting two bits of de-scrambled data bits.

18 Claims, 12 Drawing Sheets

Out=LUT_4B5B(In)

| In[3:0] | Out[4:0] |
|---|---|
| 0000 | 11110 |
| 0001 | 01001 |
| 0010 | 10100 |
| 0011 | 10101 |
| 0100 | 01010 |
| 0101 | 01011 |
| 0110 | 01110 |
| 0111 | 01111 |
| 1000 | 10010 |
| 1001 | 10011 |
| 1010 | 10110 |
| 1011 | 10111 |
| 1100 | 11010 |
| 1101 | 11011 |
| 1110 | 11100 |
| 1111 | 11101 |

FIG. 10A

Out=LUT_5B4B(In)

| In[4:0] | Out[4:0] | In[4:0] | Out[4:0] |
|---------|----------|---------|----------|
| 00000 | 11111 | 10000 | 11111 |
| 00001 | 11111 | 10001 | 11111 |
| 00010 | 11111 | 10010 | 01000 |
| 00011 | 11111 | 10011 | 01001 |
| 00100 | 11111 | 10100 | 00010 |
| 00101 | 11111 | 10101 | 00011 |
| 00110 | 11111 | 10110 | 01010 |
| 00111 | 11111 | 10111 | 01011 |
| 01000 | 11111 | 11000 | 11111 |
| 01001 | 00001 | 11001 | 11111 |
| 01010 | 00100 | 11010 | 01100 |
| 01011 | 00101 | 11011 | 01101 |
| 01100 | 11111 | 11100 | 01110 |
| 01101 | 11111 | 11101 | 01111 |
| 01110 | 00110 | 11110 | 00000 |
| 01111 | 00111 | 11111 | 11111 |

FIG. 10B

RECEIVER WITH CAPABILITY OF CORRECTING ERROR

BACKGROUND OF THE INVENTION

1. Field of the Invention

The present invention generally relates to a computer network, and more particularly to Fast Ethernet receiver with error correction capability.

2. Description of Related Art

Ethernet is a packet-based computer networking that is widely used in constructing a local area network. Fast Ethernet or 100BASE-TX, for example, transfers data at a nominal rate of 100 Mbits/sec.

Fast Ethernet or 100BASE-TX is specified in IEEE 802.3, and may be run over category 5 (CAT5) unshielded twisted-pair (UTP) at 125 MHz symbol rate with segment length of 100 meters. According to Fast Ethernet specification, Fast Ethernet may provide bit error rate (BER) of less than $10^{-9}$ without additional forward error control coding (ECC). However, the specified BER cannot be assured oftentimes in real Fast Ethernet due to, for example, aged wiring, multiple segments connection, segment longer than the specified length, cable category lower than CAT5, or non-ideal parameters such as jitter, return loss or rise/fall time.

For the reason that conventional Fast Ethernet receiver implementation cannot oftentimes provide specified performance, a need has arisen to propose a novel Fast Ethernet receiver with a capability of correcting error without additional forward error control coding (ECC).

SUMMARY OF THE INVENTION

In view of the foregoing, it is an object of the embodiment of the present invention to provide a local area network that is capable of correcting one-bit error in the inner receiver and/or correcting two-bit error in the outer receiver.

According to one embodiment, the present invention discloses a receiver with capability of correcting error. A signal processor is configured to generate an equalized signal according to a receiver input signal, and a soft slicer is configured to generate quantized data and associated soft data according to the equalized signal. A decoder with error recovery is configured to generate decoded quantized data according to the quantized data and generate a soft sequence according to the soft data, wherein the decoder with error recovery is capable of correcting one bit of the quantized data. A de-scrambler is configured to generate a de-scrambled data bit according to the decoded quantized data and the soft sequence. A serial-to-parallel (S/P) converter with code corrector is configured to generate parallel data according to the de-scrambled data bit, wherein the S/P converter with code corrector is capable of correcting two bits of the de-scrambled data bits. A code group alignment finite state machine (FSM) is configured to detect code boundary and packet boundary on the parallel data, thereby generating code data.

DETAILED DESCRIPTION OF THE INVENTION

Figure 1:
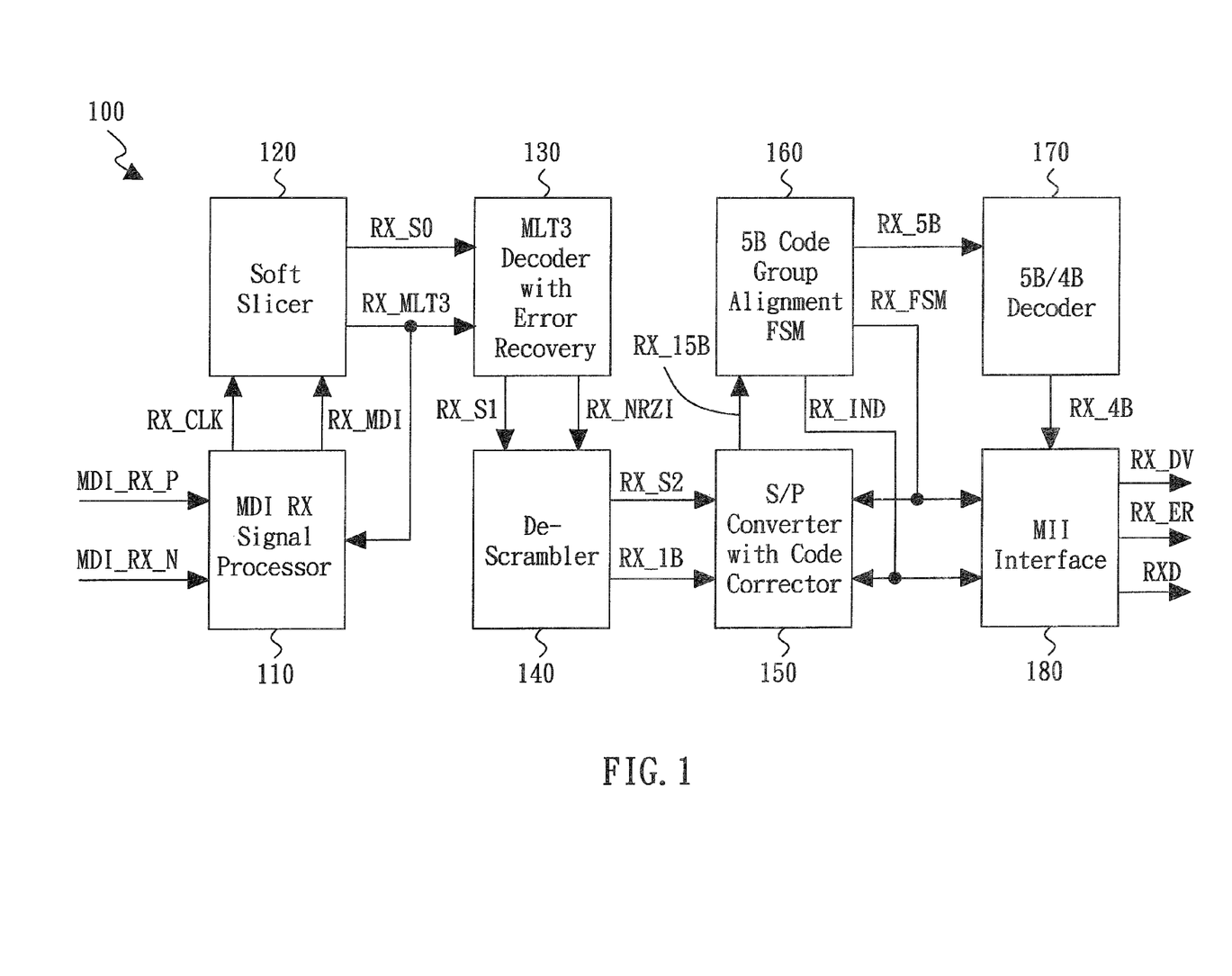
FIG. 1 is a block diagram that illustrates a Fast Ethernet receiver according to one embodiment of the present invention.

FIG. 1 is a block diagram that illustrates a Fast Ethernet receiver 100 according to one embodiment of the present invention. Fast Ethernet is specified in IEEE 802.3, particularly IEEE standard 802.3, 2000 edition Clause 24, which is hereby incorporated by reference. Although 100BASE-TX or Fast Ethernet is illustrated in the present embodiment, other local area networks such as gigabit Ethernet may be adopted as well. Moreover, it is appreciated by those skilled in the pertinent art that portion of the embodiment described below may be implemented by hardware, software, firmware, a digital signal processor, an application-specific integrated circuit (ASIC) or their combination.

The receiver 100 may be divided into two portions: an inner receiver and an outer receiver. The inner receiver includes a media dependent interface (MDI) receiver (RX) signal processor 110, a soft slicer 120 and a multi-level transmit-3 (MLT3) decoder with error recovery 130. The outer receiver includes a de-scrambler 140, a serial-to-parallel (S/P) converter with code corrector 150, a 5-bit (5B) code group alignment finite state machine (FSM) 160, a 5-bit to 4-bit (5B/4B) decoder 170 and a media independent interface (MII) 180.

Figure 2:
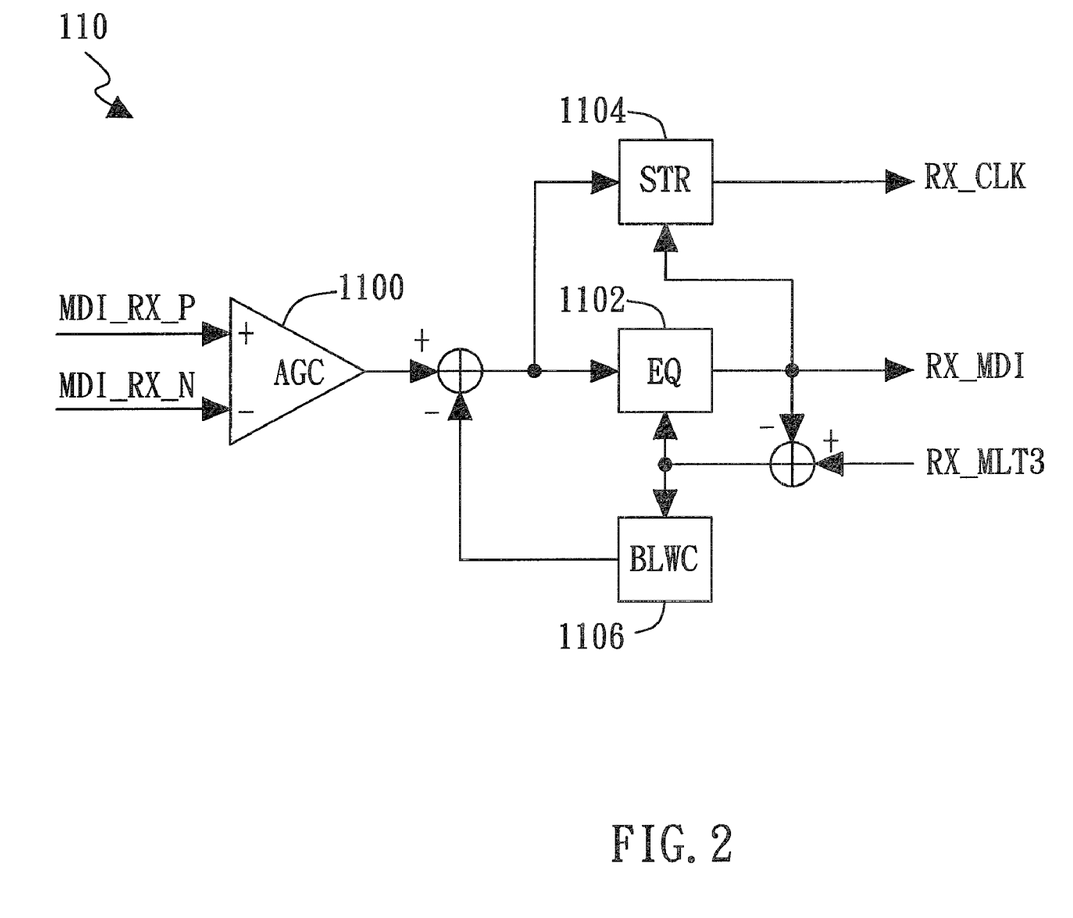
FIG. 2 shows a detailed block diagram of the MDI RX signal processor.

The MDI RX signal processor 110 receives differential signals MDI_RX_P and MDI_RX_N at the MDI interface. The MDI RX signal processor 110 may be, but not limited to, a digital signal processor (DSP). It is shown in FIG. 2 a detailed block diagram of the MDI RX signal processor 110. Specifically, the differential signals MDI_RX_P and MDI_RX_N are amplified by an automatic gain controller (AGC) 1100. The output of the AGC 1100 is then equalized by a channel equalizer (EQ) 1102, resulting in an equalized signal RX_MDI. The output of the AGC 1100 is processed by a symbol timing recovery (STR) unit 1104 to obtain recovered clock RX_CLK. A baseline wander compensator (BLWC) 1106 is used to correct baseline wander according to the equalized signal RX_MDI and a MLT3 data RX_MLT3 from the soft slicer 120.

Figure 3:
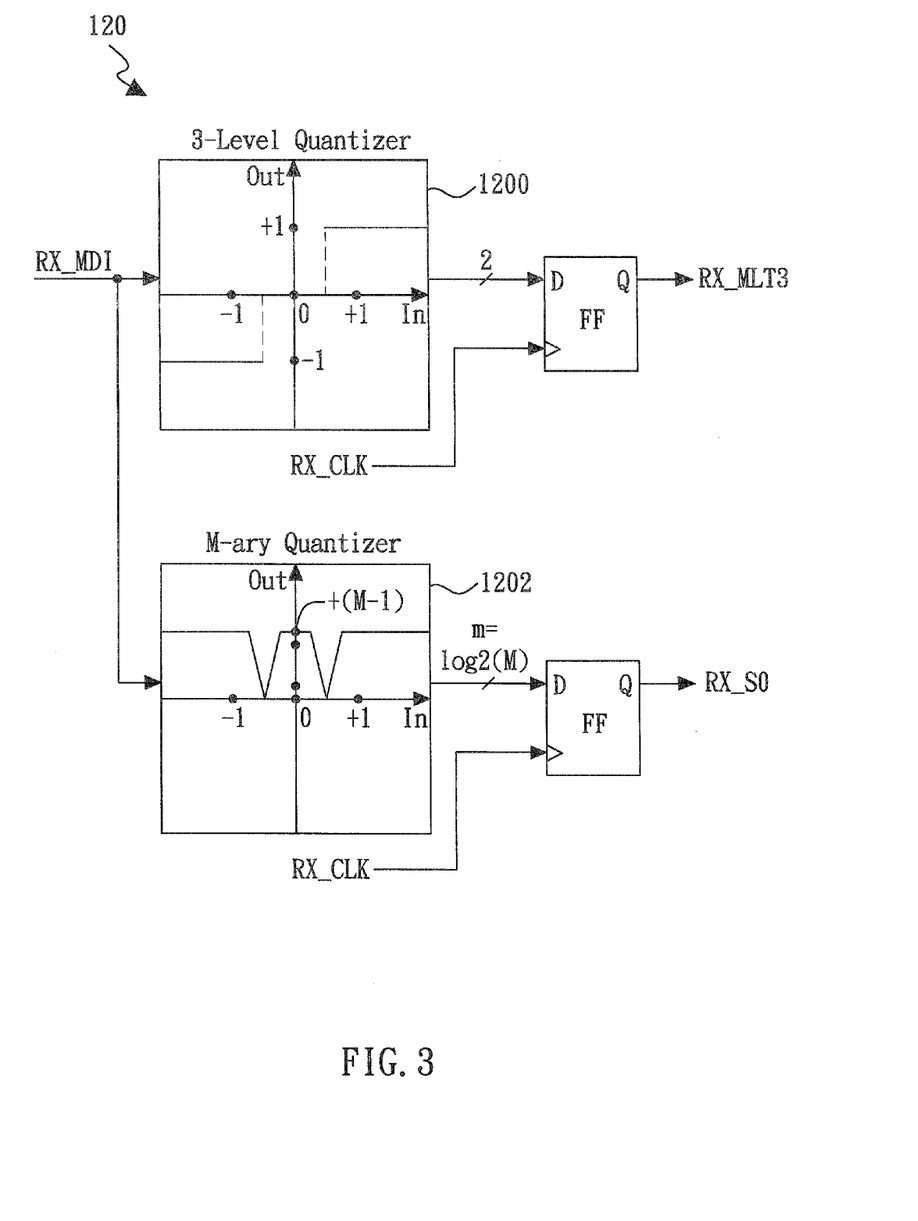
FIG. 3 shows a detailed block diagram of the soft slicer according to one embodiment of the present invention.

With respect to the soft slicer 120, it is shown in FIG. 3 a detailed block diagram of the soft slicer 120 according to one embodiment of the present invention. In the embodiment, the soft slicer 120 includes a 3-level quantizer 1200 and a multi-level or M-ary quantizer 1202. The 3-level quantizer 1200 maps the equalized signal RX_MDI onto one of three levels +1, 0 and −1, thereby resulting in 3-level quantized data or MLT3 data RX_MLT3. It is noted that each equalized signal RX_MDI is now represented by two bits of RX_MLT3. On the other hand, the M-ary quantizer 1202 maps the equalized signal RX_MDI onto one of multi-levels, thereby resulting in soft data RX_S0. It is particularly noted that the equalized signal RX_MDI nearer the middle of +1 and 0 or nearer the middle of 0 and −1 is mapped to a lower quantized data or soft data RX_S0, indicating that such signal has lower credibility or reliability. To the contrary, the equalized signal RX_MDI nearer +1, 0 or −1 is mapped to a higher quantized data or soft data RX_S0, indicating that such signal has higher credibility or reliability. It is noted that each equalized signal RX_MDI is now represented by $m=\log_2(M)$ bits of RX_S0, where M is the total levels of the M-ary quantizer 1202.

Figure 4A:
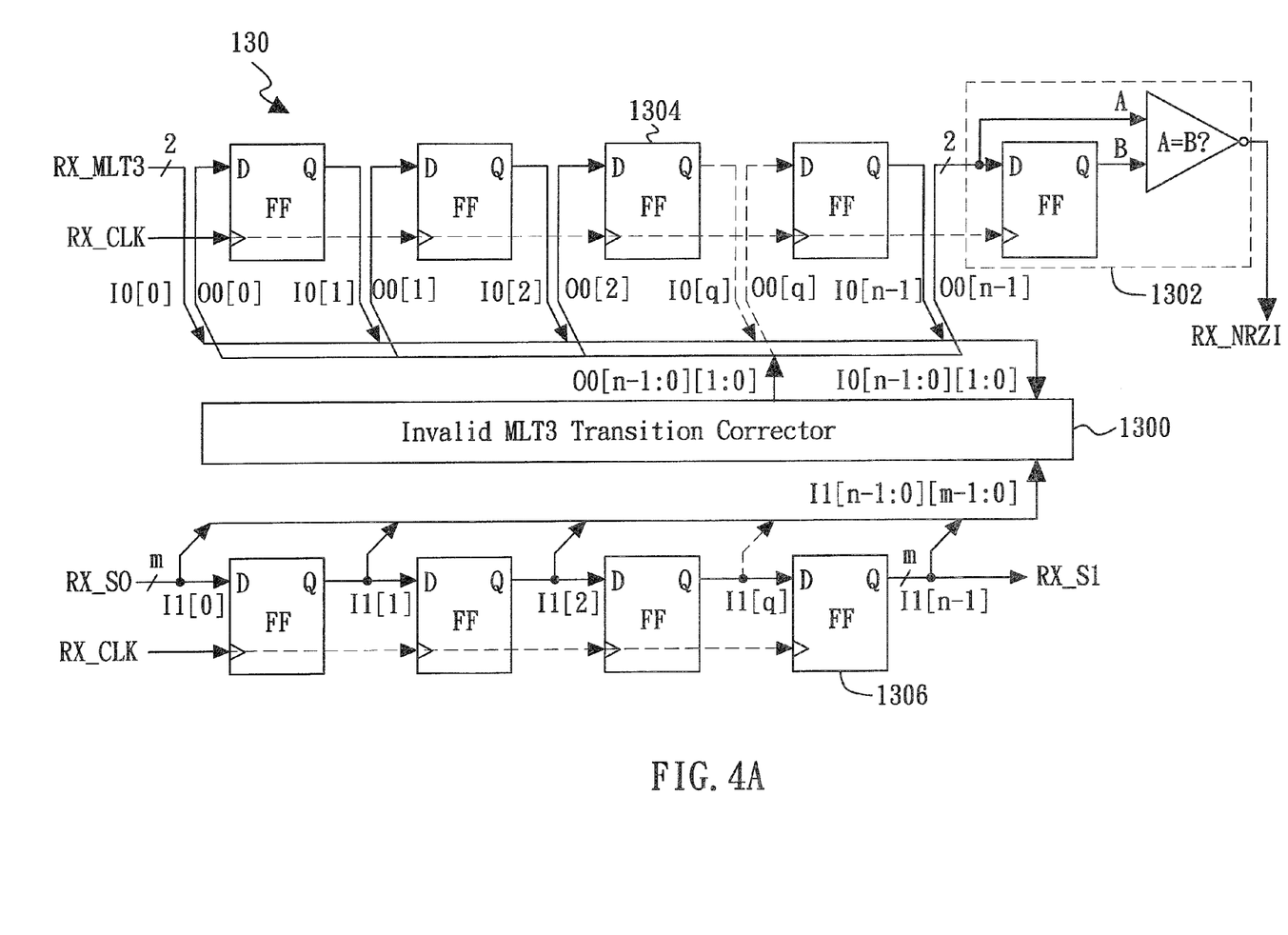
FIG. 4A shows a detailed block diagram of the MLT3 decoder according to one embodiment of the present invention.
Figure 4B:
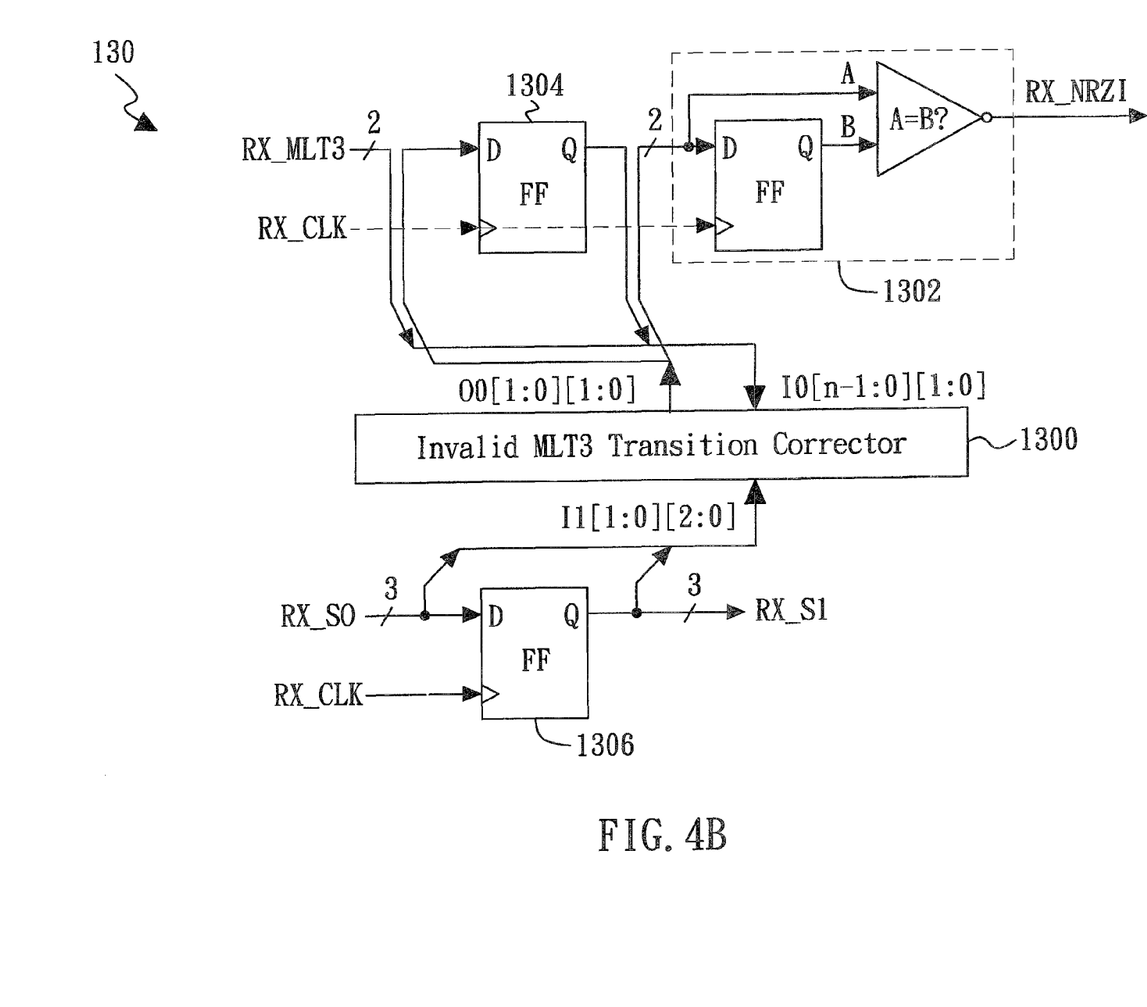
FIG. 4B shows a simplified embodiment of the MLT3 decoder.

With respect to the MLT3 decoder with error recovery 130, it is shown in FIG. 4A a detailed block diagram of the MLT3 decoder 130 according to one embodiment of the present invention. In addition to a MLT3 decode unit 1302, the MLT3 decoder 130 further includes a series of n−1 first flip-flops (FFs) 1304 for storing a sequence of MLT3 data RX_MLT3, and a series of n−1 second flip-flops (FFs) 1306 for storing a sequence of soft data RX_S0. The MLT3 decode unit 1302 outputs decoded MLT3 data RX_NRZI, and the series of FFs 1306 outputs a soft sequence RX_S1. FIG. 4B shows a simplified embodiment of the MLT3 decoder 130 with n=2 and m=3, where $m=\log_2(M)$ and M is the total levels of the M-ary quantizer 1202 (FIG. 3). The MLT3 decoder 130 further includes an invalid-MLT3-transition corrector 1300 that is capable of correcting one bit of the incoming MLT3 data RX_MLT3.

Figure 5:
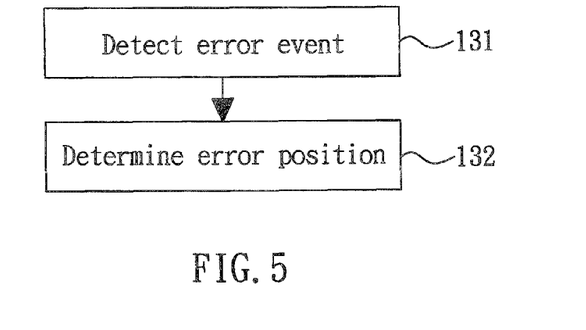
FIG. 5 shows a flow diagram of correcting invalid MLT3 transition by the invalid-MLT3-transition corrector.

The invalid-MLT3-transition corrector 1300 primarily performs two steps in order to correct the error according to the sequence of the MLT3 data RX_MLT3 and the sequence of the soft data RX_S0: (1) detect an error event that includes invalid MLT3 transition in step 131, and then (2) determine an error position in step 132 as shown in FIG. 5. It is noted that valid MLT3 out of an MLT3 encoder in a transmitter (not shown) cycles through "0", "+1", "0" and "−1." Regarding the MLT3 decoder 130 shown in FIG. 4B, its invalid-MLT3-transition corrector 1300 looks for the following event: two adjacent incoming MLT3 data RX_MLT3 that begins with "+1" or "−1" and the sum of these two MLT3 data RX_MLT3 is equal to 0. In other words, the sequence of {+1 −1} or {−1+1} are detected as an error event in step 131. Upon detecting the error event, one of the two MLT3 data RX_MLT3 is subsequently determined as the error bit to be corrected. In the embodiment, the MLT3 data RX_MLT3 that has least associated soft data RX_S0 is determined as the error bit.

Regarding the MLT3 decoder 130 shown in FIG. 4A, its invalid-MLT3-transition corrector 1300 looks for the following event: a number of incoming MLT3 data RX_MLT3 are accumulated with accumulated sum equal to +2 or −2. In other words, the sequence of {+1 0 . . . 0+1} or {−1 0 . . . 0+1} are detected as an error event in step 131. It is noted that, before the error has been ever detected, the sequence with accumulated sum equal to 0 is discarded. Upon detecting the error event, one of the two "+1" or two "−1" MLT3 data RX_MLT3 is subsequently determined as the error bit to be corrected. In the embodiment, the MLT3 data RX_MLT3 that has least associated soft data RX_S0 is determined as the error bit.

Figure 6:
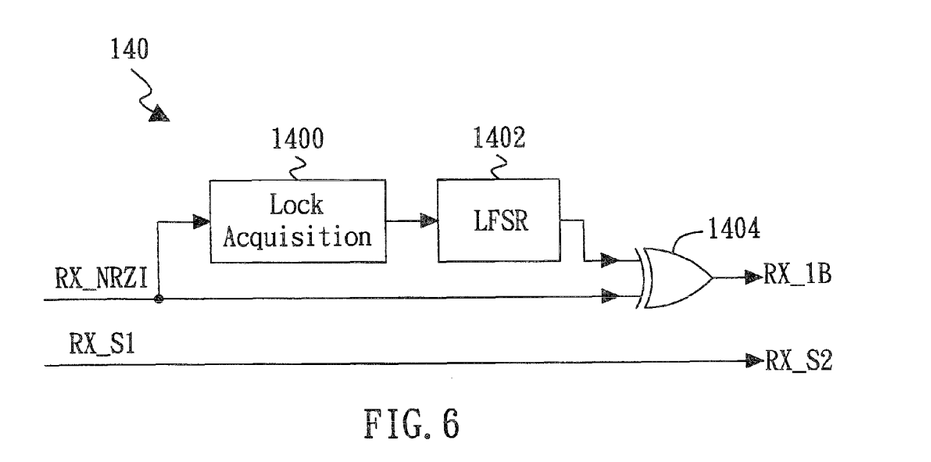
FIG. 6 shows a detailed block diagram of the de-scrambler.

The de-scrambler 140 performs de-scramble on the decoded MLT3 data RX_NRZI out of the MLT3 decoder 13, thereby resulting in de-scrambled data bit RX_1B. It is shown in FIG. 6 a detailed block diagram of the de-scrambler 140. Specifically, a lock acquisition unit 1400 generates a seed according to the decoded MLT3 data RX_NRZI. The seed is then operated by a linear feedback shift register (LFSR) 1402. The decoded MLT3 data RX_NRZI and the output of the LFSR 1402 are fed to an exclusive OR logic gate 1404, thereby resulting in the de-scrambled data bit RX_1B. At the same time, the soft sequence RX_S1 is transferred out of the de-scrambler 140 without operation, thereby resulting in the soft sequence RX_S2.

Figure 7:
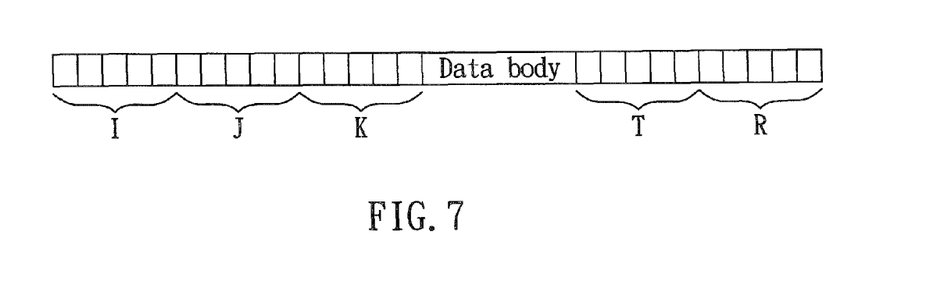
FIG. 7 schematically shows an exemplary packet that includes, in order, I code, J code, K code, packet body, T code and R code.

The 5B code group alignment FSM 160 primarily performs two functions: detecting 5-bit boundary and detecting packet boundary. FIG. 7 schematically shows an exemplary packet that includes, in order, I code, J code, K code, packet body, T code and R code, each has 5 bits. The 5-bit boundary may be detected based on the I code and the J code. The packet boundary may then be detected based on the other codes. Accordingly, the 5B code group alignment FSM 160 generates 5-bit data RX_5B. The 5B code group alignment FSM 160 also provides state TX_FSM and indicator RX_IND to the S/P converter 150 and the MII 180.

Figure 8:
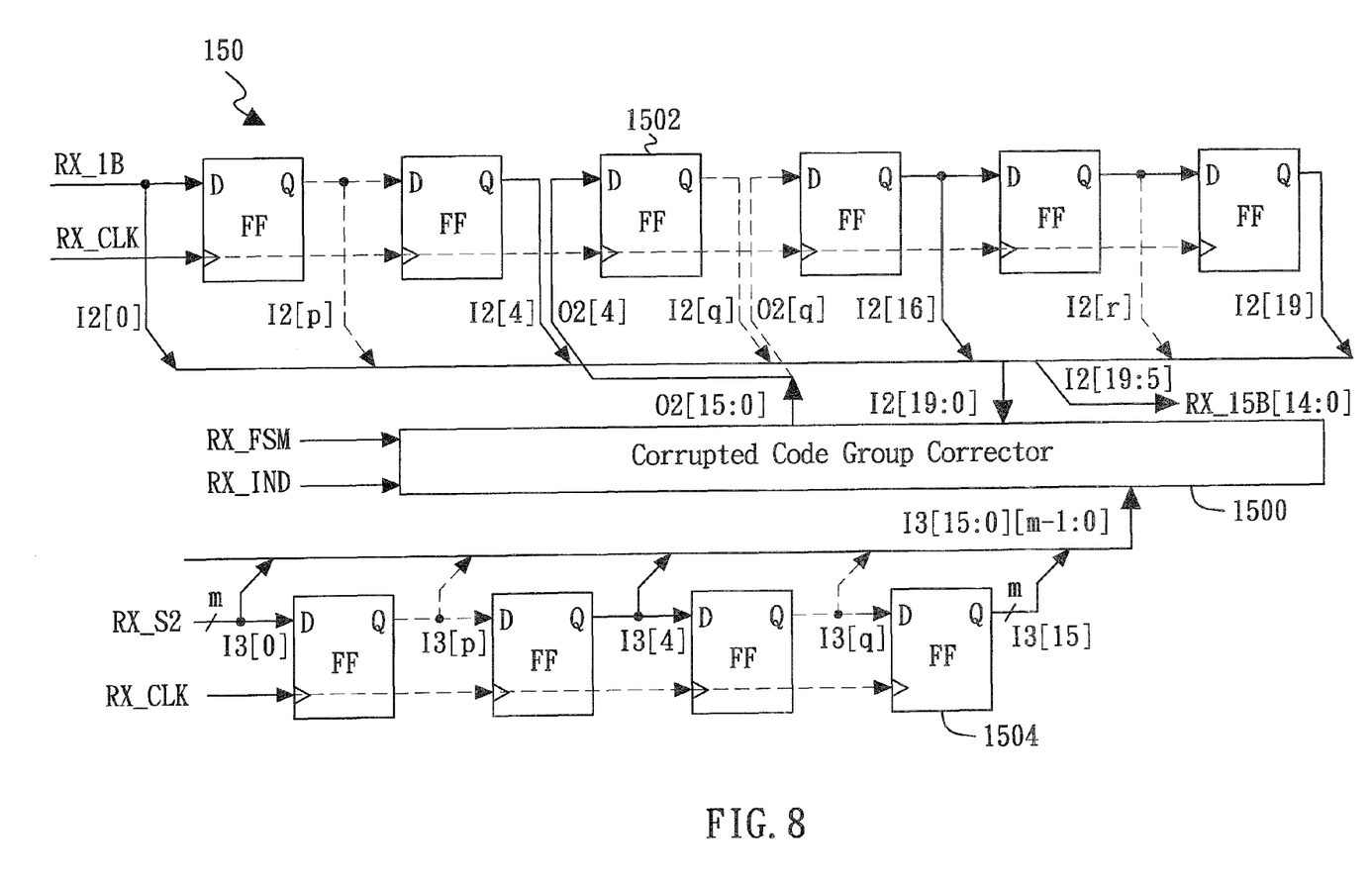
FIG. 8 shows a detailed block diagram of the S/P converter according to one embodiment of the present invention.

With respect to S/P converter with code corrector 150, it is shown in FIG. 8 a detailed block diagram of the S/P converter 150 according to one embodiment of the present invention. The S/P converter 150 includes a series, for example, of twenty first flip-flops (FFs) 1502 for storing a sequence of de-scrambled data bit RX_1B, and a series, for example, of fifteen second flip-flops (FFs) 1504 for storing a sequence of soft data RX_S2. The series of the FFs 1502 outputs parallel data RX_15B. The S/P converter 150 further includes a corrupted-code-group corrector 1500 that is capable of correcting two bits of the incoming de-scrambled data bit RX_1B.

Figure 9:
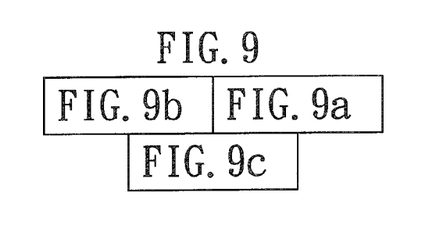
FIG. 9 shows a flow diagram of correcting corrupted code group by the corrupted-code-group corrector.
Figure 9A:
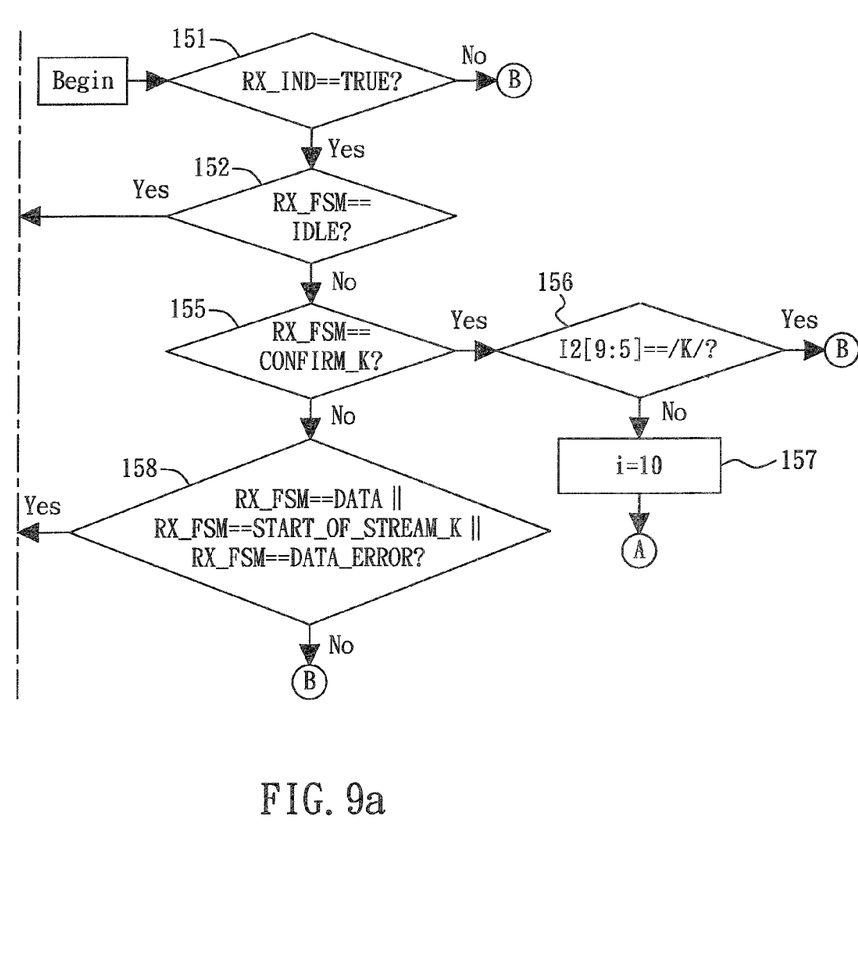
Figure 9B:
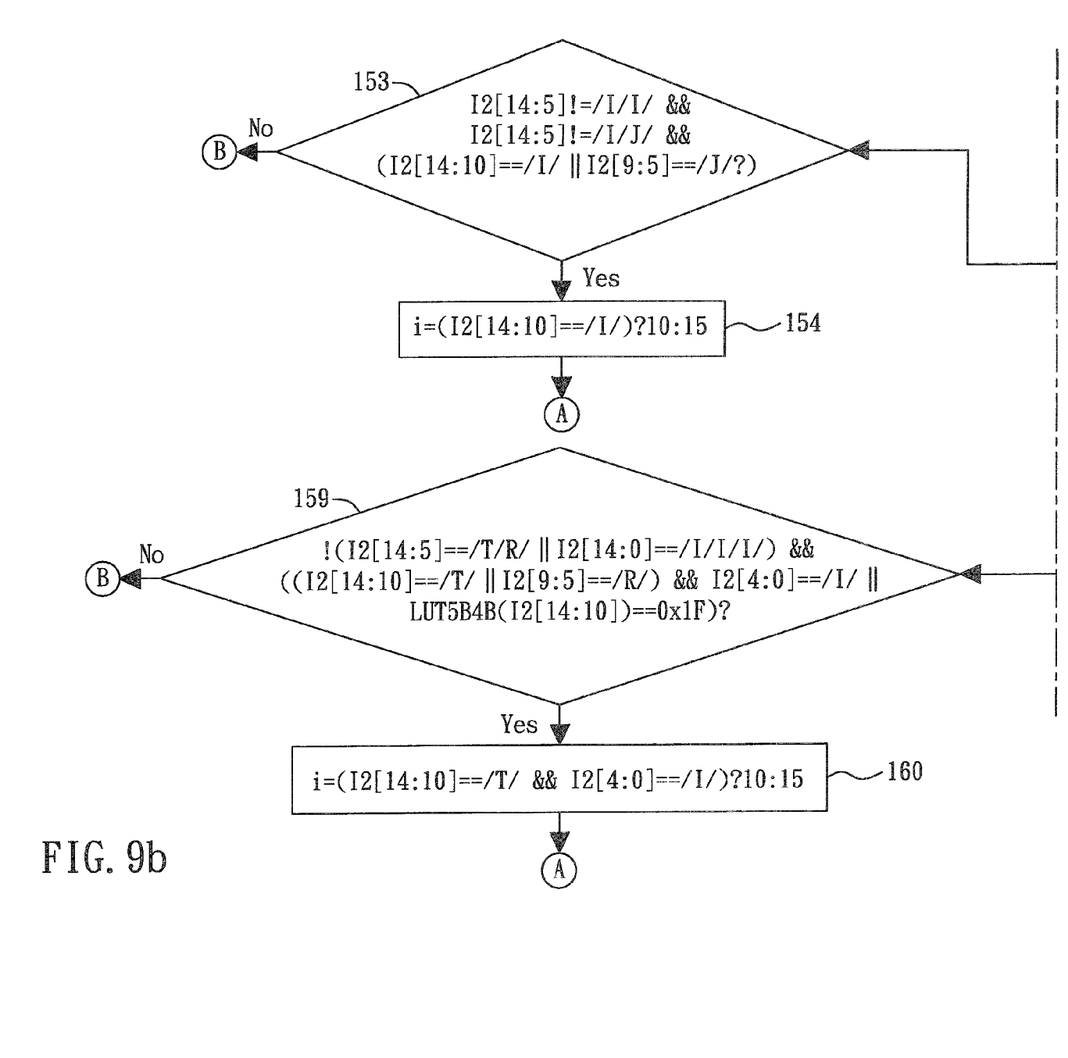
Figure 9C:
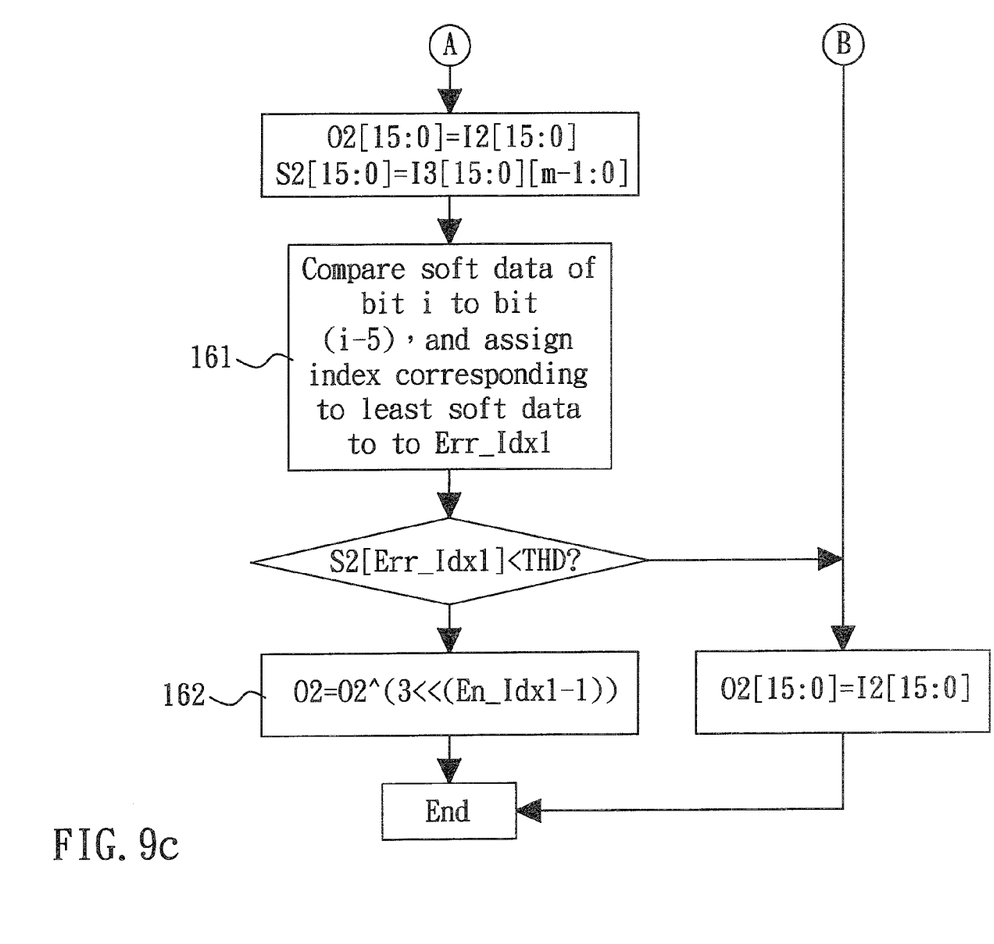

It is shown in FIG. 9 a flow diagram of correcting corrupted code group by the corrupted-code-group corrector 1500. In the embodiment, the corrupted-code-group corrector 1500 performs error correction according to status of the 5B code group alignment FSM 160, particularly according to an indicator RX_IND and a state RX_FSM. At the beginning, it is determined in step 151 whether the indicator RX_IND is logic true. A true indicator RX_IND indicates that the present status of the 5B code group alignment FSM 160 is at 5-bit boundary. The flow proceeds to step 152 when the indicator RX_IND is logic true. In step 152, it is determined whether the 5B code group alignment FSM 160 is in an idle state, which is associated with the beginning of a packet (FIG. 7). If the idle state is positively determined, the flow proceeds to step 153.

In step 153, the first two 5-bit data, i.e., I2[14:5], associated with the parallel data RX_15B are determined to detect abnormality. In a normal situation, the first two 5-bit data I2[14:5] are supposed to be either I+I code or I+J code, otherwise abnormality occurs. In step 153, the corrupted-code-group corrector 1500 intends to detect one of following abnormal cases: (a) I code followed by non-I code or non-J code, and (b) J code proceeded by non-I code. When such abnormality is detected, 2-bit error correction will be performed, which will be described later in the specification. Before that, in step 154, a value is assigned to an index i that points to the beginning bit position of I2[15:0]. In step 154, the value 10 is assigned to the index i with respect to the abnormal case (a), otherwise the value 15 is assigned to the index i.

When the 5B code group alignment FSM 160 is not in an idle state according to the determination of step 152, it is further determined in step 155 whether it is in a state of confirming K code, i.e., the state of checking K code. If the state of confirming K code is positively determined, the flow proceeds to step 156. In step 156, it is determined whether the second 5-bit data I2[9:5] is K code. If the determination is negative, abnormality occurs and the value 10 is assigned to the index i in step 157, followed by error correction.

When the 5B code group alignment FSM 160 is not in the state of confirming K code according to the determination of step 155, it is further determined in step 158 whether it is in one of following states: (1) data body state (DATA), (2) start of K code state (START_OF_STREAM_K), and (3) data error state (DATA_ERROR). The determination of step 158 is primarily associated with the ending of a packet or with the data body. If either such state is positively determined, the flow proceeds to step 159.

In step 159, data bits I2[14:0] associated with the parallel data RX_15B are determined to detect abnormality concerning the ending of a packet or the data body. With respect to the ending of a packet, the first two 5-bit data I2[14:5] are supposed to be T+R code in a normal situation. With respect to the data body, the first 5-bit data I2[14:10] should be a valid 5-bit code in a normal situation. In step 159, the corrupted-code-group corrector 1500 intends to detect one of following abnormal cases: (A) T code followed by non-R code, (B) R code proceeded by non-T code, and (C) the first 5-bit data I2[14:10] is an invalid 5-bit code. When such abnormality is detected, 2-bit error correction will be performed. Before that, in step 160, the value 10 is assigned to the index i with respect to the abnormal case (A), otherwise the value 15 is assigned to the index i.

With respect to the steps discussed above, when abnormality is detected, the soft data RX_S2, i.e., 13, of the six bits I2[i:i−5] beginning at the i-th bit are compared in step 161. Afterwards, the index corresponding to the least soft data RX_S2 is assigned to Err_Idx1, which denotes the bit position to be corrected. Finally, the bit pointed by Err_Idx1 and its succeeding bit pointed by (Err_Idx1-1) are then corrected in step 162. The reason of correcting the subsequent bit following the bit with least soft data RX_S2 is that MLT3 belongs to differential coding, for which errors occur in consecutive manner.

Figure 10A:
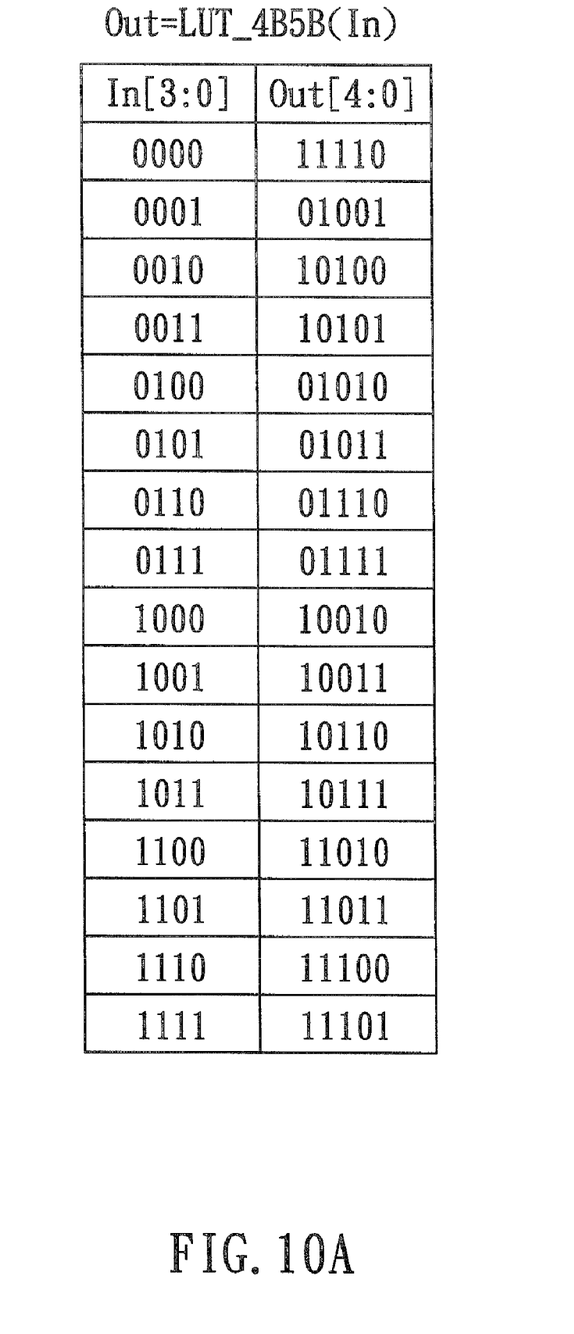
FIG. 10A shows an exemplary lookup table (LUT_4B5B) for a 4B/5B encoder in a transmitter.
Figure 10B:
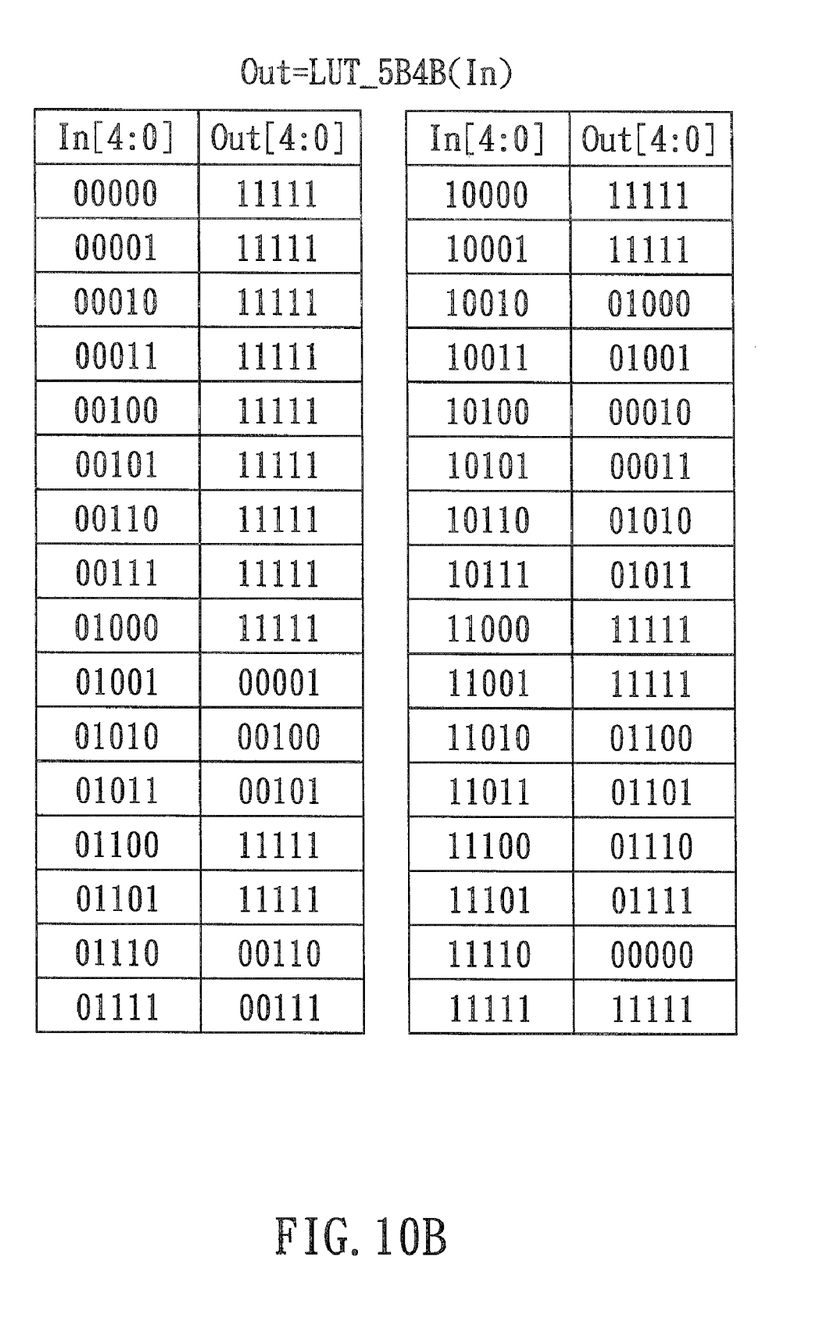
FIG. 10B shows an associated inverse lookup table (LUT_5B4B) for the 5B/4B decoder.

The 5B/4B decoder 170 decodes the 5-bit data RX_5B into decoded 4-bit data RX_4B. The mapping of the 5-bit data onto 4-bit data may be performed, for example, by a lookup table (LUT). It is shown in FIG. 10A an exemplary lookup table (LUT_4B5B) for a 4B/5B encoder in a transmitter (not shown). It is further shown in FIG. 10B an associated inverse lookup table (LUT_5B4B) for the 5B/4B decoder 170 that inversely maps 5-bit data back to 4-bit data. It is noted that the least significant four bits of the outputs in the inverse LUT (LUT_5B4B) corresponds to the 4-bit input in the LUT (LUT_4B5B), and some outputs in the inverse LUT (LUT_5B4B) are invalid and are denoted as "11111."

The MII 180 receives the decoded 4-bit data RX_4B, the state TX_FSM and the indicator RX_IND, and accordingly generates a packet signal RX_DV, an error signal RX_ER and packet data RXD, which are then forwarded to a next layer, i.e., media access control (MAC) layer.

Table 1 listed below compares the performance, e.g., bit error rate (BER), packet error rate (PER) and packet loss rate (PLR), between the present embodiment and traditional counterpart. It is observed that the performance of the present embodiment is more than two times better than the traditional implementation.

TABLE 1

| Conditions: | Simulation Time 256 ms | Channel Type 170 m(CAT5) BER_Ratio | Packet Length 256 bytes PER_Ratio | IPG 0.96 us PLR_Ratio |
|---|---|---|---|---|
| Traditional realization (w/o FEC protection, only error detection) | | 3.16E−05 | 493/11576 (4.26%) | 3/11576 |
| with inner RX correction (invalid MLT3 transition, n = 2, m = 3) | | 2.71E−05 | 383/11576 (3.31%) | 2/11576 |
| with inner RX correction (invalid MLT3 transition, n = 2, m = 3) + with outer RX correction (unmapping code group) | | 1.37E−05 | 188/11576 (1.62%) | 0/11576 |

Although specific embodiments have been illustrated and described, it will be appreciated by those skilled in the art that various modifications may be made without departing from the scope of the present invention, which is intended to be limited solely by the appended claims.

What is claimed is:

1. A receiver with capability of correcting error, comprising:
    a signal processor configured to generate an equalized signal according to a receiver input signal;
    a soft slicer configured to generate quantized data and associated soft data according to the equalized signal;
    a decoder with error recovery configured to generate decoded quantized data according to the quantized data and generate a soft sequence according to the soft data, wherein the decoder with error recovery is configured to correct one bit of the quantized data;
    a de-scrambler configured to generate a de-scrambled data bit according to the decoded quantized data and the soft sequence;
    a serial-to-parallel (S/P) converter with code corrector configured to generate parallel data according to the de-scrambled data bit, wherein the S/P converter with code corrector is configured to correct two bits of the de-scrambled data bits; and
    a code group alignment finite state machine (FSM) configured to detect code boundary and packet boundary on the parallel data, thereby generating code data.

2. The receiver of claim 1, wherein the signal processor comprises:
    an automatic gain controller (AGC) configured to amplify the receiver input signal; and
    a channel equalizer configured to equalize an output of the AGC, thereby resulting in the equalized signal.

3. The receiver of claim 2, further comprising a symbol timing recovery (STR) unit configured to generate a recovered clock.

4. The receiver of claim 1, wherein the soft slicer comprises:
    a 3-level quantizer configured to map the equalized signal onto one of three levels +1, 0 and −1, thereby resulting in the quantized data; and a multi-level quantizer configured to map the equalized signal onto one of multi-levels, thereby resulting in the soft data;

wherein the equalized signal near middle of +1 and 0 or near middle of 0 and −1 is mapped to lower soft data, and the equalized signal near +1, 0 or −1 is mapped to high soft data.

5. The receiver of claim 1, wherein the decoder with error recovery comprises:

a decode unit configured to generate decoded quantized data;

a series of first flip-flops configured to store a sequence of the quantized data;

a series of second flip-flops configured to store a sequence of the soft data, thereby resulting in the soft sequence; and an invalid transition corrector configured to correct the error according to the sequence of the quantized data and the soft sequence.

6. The receiver of claim 5, wherein the invalid transition corrector performs following steps:

detecting an error event that includes invalid, transition, of the quantized data; and determining an error position of the detected event that has the least associated soft data.

7. The receiver of claim 1, wherein the de-scrambler comprises:

a lock acquisition unit configured to generate a seed according to the decoded quantized data;

a linear feedback shift register (LFSR) configured to operate the seed; and an exclusive OR logic gate coupled to receive the decoded quantized data and an output of the LFSR, thereby resulting in the de-scrambled data bit.

8. The receiver of claim 1, wherein the 5-bit boundary is detected based on I code and J code, and the packet boundary is detected based on K code, T code and R code.

9. The receiver of claim 8, wherein the 5-bit code group alignment FSM further generates an indicator and a state to the S/P converter with code corrector.

10. The receiver of claim 9, wherein the S/P converter with code corrector comprises:

a series of first flip-flops configured to store a sequence of the de-scrambled data bits;

a series of second flip-flops configured to store the soft sequence; and a corrupted code group corrector configured to correct the error according to the sequence of the de-scrambled data bits and the soft sequence.

11. The receiver of claim 10, wherein the corrupted code group corrector performs the error correction according to the indicator and the state generated from the 5-bit code group alignment FSM, wherein the indicator with logic true value indicates that status of the 5-bit code group alignment FSM is at 5-bit boundary.

12. The receiver of claim 11, wherein the corrupted code group corrector performs following steps:

determining first two 5-bit data of the stored sequence of the de-scrambled data bits to detect abnormality when the indicator is logic true and the state is in an idle state;

upon detecting the abnormality, the soft data associated with a portion of the stored sequence of the de-scrambled data bits are compared; and correcting a data bit with the least soft data and a succeeding data bit.

13. The receiver of claim 11, wherein the corrupted code group corrector performs following steps:

determining whether second 5-bit data of the stored sequence of the de-scrambled data bits are the K code when the indicator is logic true, the state is not in an idle state and the state is confirming the K code;

comparing the soft data associated with a portion of the stored sequence of the de-scrambled data bits; and correcting a data bit with the least soft data and a succeeding data bit.

14. The receiver of claim 11, wherein, the corrupted code group corrector performs following steps:

determining the stored sequence of the de-scrambled data bits to detect abnormality when the indicator is logic true, the state is not in an idle state, the state is not confirming the K code, and the status of the 5-bit code group alignment FSM is associated with ending of a packet or with data body;

upon detecting the abnormality, the soft data associated with a portion of the stored sequence of the de-scrambled data bits are compared; and correcting a data bit with the least soft data and a succeeding data bit.

15. The receiver of claim 1, wherein the code group alignment FSM is a 5-bit code group alignment FSM that generates 5-bit data.

16. The receiver of claim 15, further comprising a 5-bit to 4-bit (5B/4B) decoder configured to decode the 5-bit data into decoded 4-bit data.

17. The receiver of claim 16, wherein the 5-bit data is mapped onto the 4-bit data by a lookup table (LUT).

18. The receiver of claim 16, further comprising a media independent interface (MIT) coupled to receive the decoded 4-bit data and accordingly generate a packet signal, an error signal and packet data.

* * * * *